(12) United States Patent
Shimizu et al.

(10) Patent No.: US 6,914,208 B2
(45) Date of Patent: Jul. 5, 2005

(54) METHOD FOR SEMICONDUCTOR WAFER ETCHING

(75) Inventors: Akira Shimizu, Tama (JP); Kunitoshi Nanba, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/706,624

(22) Filed: Nov. 12, 2003

(65) Prior Publication Data

US 2004/0105671 A1 Jun. 3, 2004

Related U.S. Application Data

(62) Division of application No. 10/068,092, filed on Feb. 5, 2002, now Pat. No. 6,764,572.

(30) Foreign Application Priority Data

Mar. 1, 2001 (JP) ........................................ 2001-056685

(51) Int. Cl.[7] ............................................. B23K 10/00
(52) U.S. Cl. ............................ 219/121.43; 219/121.41; 219/678; 156/345.41; 438/799
(58) Field of Search ..................... 219/121.4, 121.41, 219/121.43, 497, 678; 352/418; 118/724, 725; 156/345.27, 345.36, 345.41, 345.52; 438/726, 799, 487

(56) References Cited

U.S. PATENT DOCUMENTS

| 4,804,431 A | | 2/1989 | Ribner |
|---|---|---|---|
| 4,910,042 A | | 3/1990 | Hokynar |
| 5,023,056 A | | 6/1991 | Aklufi et al. |
| 5,131,842 A | | 7/1992 | Miyazaki et al. |
| 5,468,297 A | | 11/1995 | Letort |
| 5,489,362 A | | 2/1996 | Steinhardt et al. |
| 5,609,774 A | | 3/1997 | Yamazaki et al. |
| 5,750,211 A | | 5/1998 | Weise et al. |
| 5,795,831 A | | 8/1998 | Nakayama et al. |
| 5,954,911 A | | 9/1999 | Bergman et al. |
| 6,133,076 A | * | 10/2000 | Yamazaki et al. .......... 438/166 |
| 6,714,300 B1 | * | 3/2004 | Rosencwaig et al. ....... 356/369 |
| 2002/0002950 A1 | * | 1/2002 | Tsuchihashi et al. ........ 118/724 |
| 2002/0073922 A1 | * | 6/2002 | Frankel et al. .............. 118/715 |

OTHER PUBLICATIONS

D.F. Weston, et al. HF vapor phase etching (HF/VPE): Production viability for semiconductor manufacturing and reaction model, J. Vac. Scie. Technol., 17(1) Jan./Feb. 1980, 1980 American Vacuum Society, pp. 466–468.

* cited by examiner

Primary Examiner—Mark Paschall
(74) Attorney, Agent, or Firm—Knobbe, Martens, Olson & Bear LLP

(57) ABSTRACT

A batch-type etching method includes applying microwaves from the outside of a reaction chamber to semiconductor wafers after HF gas etching of the wafers to remove residual substances including $H_2O$, $CH_3OH$, $CH_3COOH$ and/or other by-products from surfaces of the wafers. Microwaves oscillate polar molecules of the substances and generate heat, thereby removing the substances.

17 Claims, 1 Drawing Sheet

METHOD FOR SEMICONDUCTOR WAFER ETCHING

This application is a divisional of U.S. patent application Ser. No. 10/068,092, filed Feb. 5, 2002, now U.S. Pat. No. 6,764,572 which claims priority to Japanese Patent Application No. 2001-056685, filed Mar. 1, 2001, and the disclosure of which is incorporated herein by reference in its entirety.

BACKGROUND OF THE INVENTION

1. Field of the Invention

The present invention generally relates to a batch-type etching apparatus for semiconductor wafers and a method for etching semiconductor wafers using the apparatus, and more particularly relates to a semiconductor etching apparatus and method that completely removes contaminating residue found on the surface of a semiconductor wafer after etching.

2. Description of the Related Art

When semiconductor wafers must be processed before a deposition process, wet cleaning, commonly referred to as "RCA cleaning," has been used for a long time. The process of RCA cleaning involves removal of a silicon spontaneous oxidation film and chemical oxide using diluted hydrofluoric acid (HF) in the final process. Such removal occurs after the semiconductor wafers have been processed for removal of noble metals, hydrocarbons, and other contaminating particles.

In recent years, as devices have become more highly integrated, there have been stronger demands for reducing particle contamination and for decreasing the amount of chemicals used and waste liquid produced. For these reasons, in place of wet etching, vapor etching has been discussed. More particularly, as pretreatment for contact hole filling and gate electrode deposition, a vapor HF etching process, which removes a silicon spontaneous oxidation film, has attracted attention.

In conventional batch-type wet etching devices, because semiconductor wafers are exposed to the atmosphere when transferred into a deposition device after the wet etching process, silicon oxidation films spontaneously re-grow on the semiconductor wafers. The presence of this silicon spontaneous oxidation film on the semiconductor wafer causes increased contact resistance and poor deposition in selective growth process. Additionally, because etching devices partially using vapor HF use etching under atmospheric pressure, such devices cannot be integrated with vacuum load lock type CVD equipment. Thus, etching devices partially using vapor HF also cause silicon oxidation films to spontaneously re-grow on the semiconductor wafers. Although etching devices using plasma have been proposed (Japanese Patent Laid-open No.1987-76632, Japanese Patent Laid-open No.1990-143418), these devices can be integrated only with single-wafer processing type equipment, thereby limiting their use.

Therefore, a batch-type etching device using vapor HF at reduced pressure was proposed. To etch a silicon spontaneous oxidation film at reduced pressure, it is required to cause $H_2O$, $CH_3OH$ or $CH_3COOH$ gas to adsorb on the surface of a semiconductor wafer to dissociate HF. HF gas dissociates on the semiconductor wafer surface and etches the silicon spontaneous oxidation film by the following reaction:

$$SiO_2 + 4HF \rightarrow SiF_4 + 2H_2O$$

An etching device using vapor HF at reduced pressure can be easily integrated with CVD equipment possessing a $N_2$ purge box and a vacuum load lock chamber. A problem such as spontaneously re-growing a silicon spontaneous oxidation film does not occur.

There are, however, several problems with such a configuration. In a state in which the air inside a reaction chamber is evacuated after etching is completed, $H_2O$, $CH_3OH$ or $CH_3COOH$ and reaction by-products remain on the surface of semiconductor wafers. These can be removed to some extent by cyclically filling and purging the reaction chamber with $N_2$ after the etching (a process commonly referred to as "cycle purging"), but they cannot be removed completely. Furthermore, some of these contaminants may be introduced into the CVD equipment, causing further contamination. Additionally, cycle purging takes a long time and therefore lowers productivity.

These residual adsorbates can easily be desorbed and removed by heating. Additionally, an adsorption layer comprising $H_2O$, $CH_3OH$ or $CH_3COOH$ cannot be formed if the temperature of the semiconductor wafer is high. Consequently, HF cannot dissociate and a silicon spontaneous oxidation film will not be etched. However, heating must be conducted after etching is completed, and such heating takes a significant amount of time because the thermal capacity of the reaction chamber is large. Additionally, after heating it takes a significant amount of time to cool the reaction chamber to room temperature to prepare for etching of the next lot. These prolonged heating and cooling times further lower productivity substantially.

SUMMARY OF THE INVENTION

One object of the present invention is to provide a batch-type etching device and a method for using such a device for vapor HF etching of a silicon spontaneous oxidation film or chemical oxide on a semiconductor silicon substrate or on amorphous silicon. Such a batch-type etching device can be easily integrated with CVD equipment possessing a $N_2$ purge box or a vacuum load lock chamber.

Another object of the present invention is to provide a batch-type etching device and a method using such a device to enable a stable process with high reproducibility by preventing contamination of the CVD equipment by effectively using microwave energy to remove adsorbing and remaining $H_2O$, $CH_3OH$ or $CH_3COOH$ and by-products on the surface of a semiconductor wafer after etching.

Another object of the present invention is to provide a batch-type etching device and a method for using such a device with high productivity by quickly removing $H_2O$, $CH_3OH$ or $CH_3COOH$ and by-products adsorbing and remaining in the CVD chamber, which are sources of contamination.

BRIEF DESCRIPTION OF THE DRAWINGS

The preferred embodiments of the semiconductor wafer etching apparatus and method, illustrating its features, will now be described in detail. These embodiments depict the novel and non-obvious semiconductor wafer etching apparatus and method shown in the accompanying drawing, which is for illustrative purposes only.

DETAILED DESCRIPTION OF THE PREFERRED EMBODIMENTS

Figure 1:
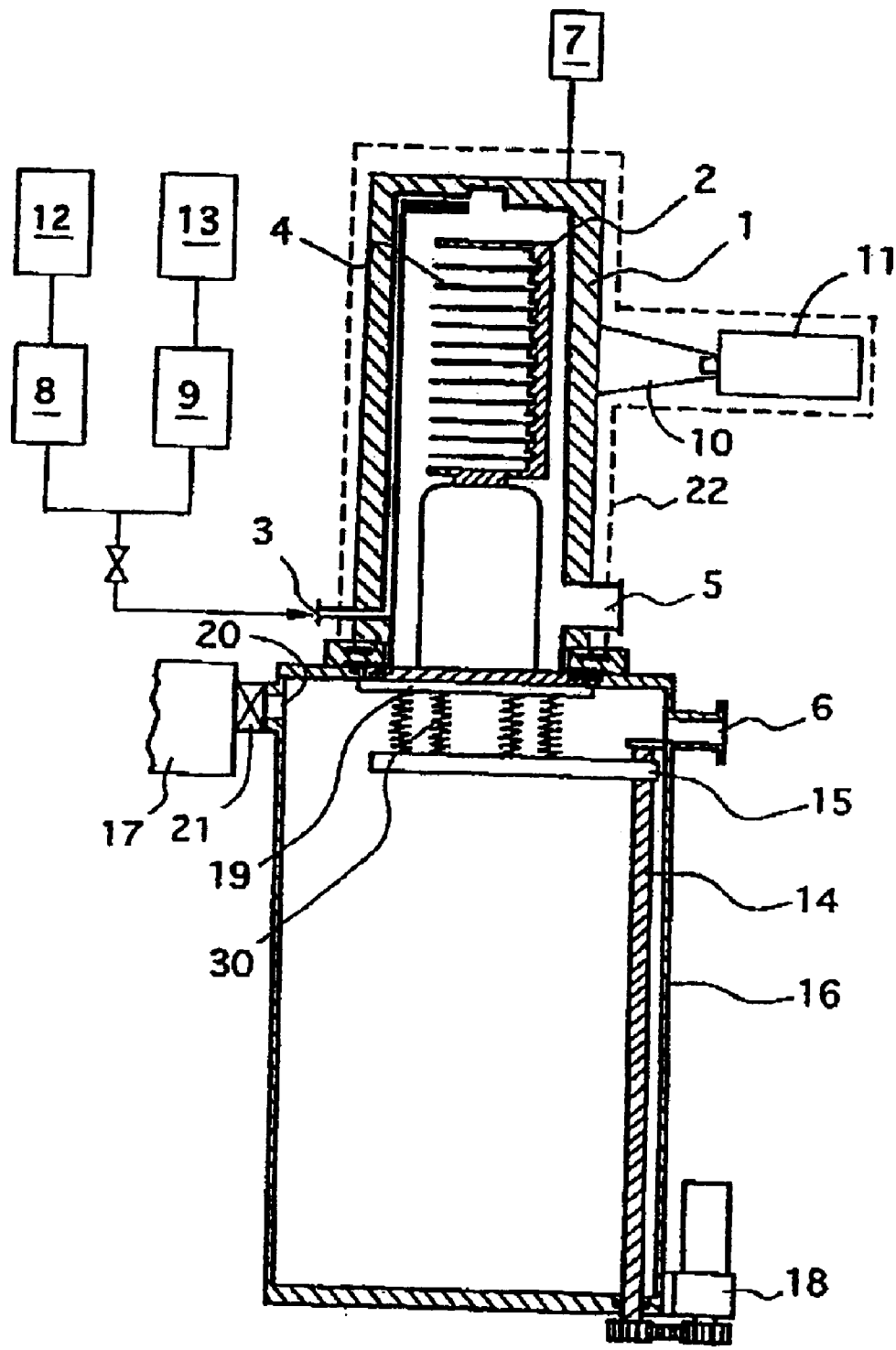
FIG. 1 is a schematic cross-section of a preferred embodiment according to the present invention.

As illustrated in FIG. 1, an apparatus for etching semiconductor wafers according to one embodiment of the present invention comprises a reaction chamber 1, a reaction chamber exhaust port 5 adapted to evacuate the air inside the reaction chamber 1, a wafer-supporting boat 2 adapted to support at least one batch of semiconductor wafers 4 inside the reaction chamber 1, an inlet port 3 adapted to bring a reaction gas inside the reaction chamber 1, and a microwave generator 11 that is combined with the reaction chamber 1. The microwave generator 11 is adapted to apply microwaves to the interior of the reaction chamber 1 after etching is completed, thereby causing substances adsorbing and remaining on the semiconductor wafers 4 to be desorbed and removed.

A method for etching semiconductor wafers according to one embodiment of the present invention comprises evacuating the air inside the reaction chamber 1, introducing a reaction gas to the reaction chamber 1 via a gas inlet port 3 until a given pressure is attained, etching multiple semiconductor wafers 4 for a given time, evacuating the gas inside the reaction chamber 1 after etching is completed, and applying microwaves to the semiconductor wafers for a given time.

In preferred embodiments, the reaction chamber 1 and the wafer-supporting boat 2 are comprised of a material which has corrosion resistance against HF and which does not absorb microwaves. For example, the reaction chamber 1 and the wafer-supporting boat 2 may be comprised of $Al_2O_3$ or polypropylene. In such embodiments, the frequency of the microwaves is approximately 2.45 GHz, and the reaction gas comprises HF gas and at least one type of $H_2O$, $CH_3OH$ or $CH_3COOH$ gas.

The wafer-supporting boat 2 housing a plurality of semiconductor wafers 4 is loaded by a moving mechanism, described later, into the reaction chamber 1. A vacuum pump (not shown) for evacuating the air inside the reaction chamber 1 is linked to the reaction chamber 1 via a reaction chamber exhaust port 5. Mass flow controllers 8 and 9 for bringing reaction gases are also connected to the reaction chamber 1. The reaction gases supplied from gas sources 12 and 13 are flow-controlled by the respective mass flow controllers 8 and 9 and are introduced into the reaction chamber 1 via a gas inlet port 3. The reaction gases comprise $H_2O$ gas, $CH_3OH$ gas, or $CH_3COOH$ gas supplied from gas source 12, as well as HF gas supplied from the gas source 13. Because the gases to be adsorbed on the surface of a semiconductor wafer are used for the purpose of dissociating HF, gasses other than the above-mentioned reaction gasses such as $C_2H_5OH$ gas may also be used. Use of $CH_3COOH$ gas is preferable because its use prevents adsorption of $H_2O$ generated during etching into an adsorption layer and keeps a constant etching speed. Pressure gauge 7, connected to the reaction chamber 1, measures the pressure inside the reaction chamber and transmits the value measured to the mass flow controllers 8 and 9. The mass flow controllers 8 and 9 receive the value measured and control the flow of reaction gases accordingly to obtain a desired pressure inside the reaction chamber 1.

The wafer moving mechanism comprises a ball screw 14, a movable body 15 and a drive motor 18. The ball screw 14 and the movable body 15 are arranged inside a boat elevator chamber ("BEC") 16 to be sealed from the atmosphere. The BEC 16 has a BEC exhaust port 6 for evacuating the air inside the BEC. The BEC exhaust port 6 is linked to the above-mentioned vacuum pump (not shown). At the bottom of the wafer-supporting boat 2, a seal flange 19 is provided. Preferably, an elastic body 30, such as a spring, is provided between the seal flange 19 and the movable body 15. When the drive motor 18 causes the ball screw 14 to rotate, the movable body 15 is raised, causing the seal flange 19 to contact a sealing surface of the reaction chamber 1. As the movable body 15 is raised further, the reaction chamber seal becomes complete due to the elastic force of the elastic body 30. In the BEC 16, an opening 20 for moving semiconductor wafers in and out of the wafer-supporting boat 2 is provided and is linked to a vacuum load lock chamber 17 via a gate valve 21. In the vacuum load lock chamber 17, a transfer mechanism for moving semiconductor wafers in and out of the wafer-supporting boat 2 is provided.

On the exterior side of the reaction chamber 1, a microwave generator 11 is connected to the reaction chamber 1 via a waveguide 10. The microwave generator 11 preferably produces microwaves at approximately 2.45 GHz, which are then applied, via waveguide 10, to semiconductor wafers 4 that have been loaded onto the wafer-supporting boat 2 inside the reaction chamber. Applying microwaves at approximately 2.45 GHz to the semiconductor wafers causes only $H_2O$, $CH_3OH$, or $CH_3COOH$ and any by-products adsorbing and remaining on the surface of the semiconductor wafers 4 to be polarized and oscillated. Thus, $H_2O$, $CH_3OH$, or $CH_3COOH$ and any by-products can thereby be desorbed and removed via the reaction chamber exhaust port 5 by the vacuum pump (not shown). The frequency of the microwaves is not limited to 2.45 GHz, and other frequencies may be used. Preferably, the entire reaction chamber 1 is covered by an aluminum shield 22 adapted to confine the microwaves.

A method for etching using the batch-type etching device according to the present invention is described next. When the wafer-supporting boat 2 is loaded inside the reaction chamber 1, the air inside the reaction chamber is evacuated via the reaction chamber exhaust port 5 by the vacuum pump (not shown). After the reaction chamber is substantially evacuated, $CH_3COOH$ gas is brought into the reaction chamber 1 from the gas source 12 via the mass flow controller 8 and through the gas inlet port 3 until the pressure inside the reaction chamber reaches approximately 500 Pa. The $CH_3COOH$ gas forms an adsorption layer for dissociating HF on the surface of the semiconductor wafers 4. HF gas is brought into the reaction chamber 1 from the gas source 13 via the mass flow controller 9 and through the gas inlet port 3 until the pressure inside the reaction chamber reaches approximately 1000 Pa. At this time, the entire reaction chamber 1 is kept at room temperature. When the HF gas is brought inside the reaction chamber 1, it dissociates by being taken up by the $CH_3COOH$ layer adsorbing on the semiconductor wafers 4, and thereby etches a silicon spontaneous oxidation film on the semiconductor wafers 4. Etching is conducted for a given time corresponding to process conditions.

After etching is completed, the residual gas is removed by evacuating the reaction chamber 1. After this evacuation, approximately 600 W of power is applied to the microwave generator 11 to generate microwaves at approximately 2.45 GHz. However, power applied to the microwave generator 11 is not limited to 600 W, and other wattages may be applied. The microwaves generated are applied to the reaction chamber 1 for approximately two minutes via the waveguide 10. However, microwave irradiation time is not limited to two minutes. The microwaves penetrate through the polypropylene reaction chamber 1 and the wafer-supporting boat 2 and are applied to the semiconductor wafers 4. The $H_2O$, $CH_3OH$ or $CH_3COOH$ adsorption layer, as well as any by-products adsorbing and remaining on the semiconductor wafers 4, are desorbed by polarization and oscillation, and are then evacuated from the reaction chamber via reaction chamber exhaust port 5 by the vacuum pump (not shown). At this time, it is preferable to fill the reaction chamber 1 with $N_2$ gas at least once.

Experimental results of HSG formation processing are illustrated in the table below. In "Example 1," no microwave radiation was introduced into the reaction chamber 1 during etching, thereby necessitating five $N_2$ purge cycles. In "Example 2," microwave radiation was introduced into the reaction chamber 1 according to one embodiment of the present invention, thereby permitting the use of only one $N_2$ purge cycle. For purposes of comparison, the capacity increasing rate was based on a sample dope a-Si P concentration of $10^{-20}$ atoms $cm^{-3}$.

|  | Item | Example 1 | Example 2 |
|---|---|---|---|
| Etching Steps | $CH_3COOH$ pressure (Pa) | 500 | 500 |
|  | HF pressure (Pa) | 500 | 500 |
|  | Etching time (sec) | 90 | 90 |
|  | Etched depth (nm) | 7 | 7 |
|  | Microwave irratiation | off | at 2.45 GHz |
| Purging Steps | $N_2$ purge cycles | 5 cycles | 1 cycle |
|  | Purge time (min) | 25 | 5 |
|  | Total time (min) | 35 | 15 |
| HSG Formation Steps | Temperature (° C.) | 560 | 560 |
|  | Processing gas | 40% $SiH_4$ | 40 $SiH_4$ |
|  | Flow ($cm^3$ $min^{-1}$) | 60 | 60 |
|  | Seeding time (min) | 25 | 25 |
|  | Annealing time (min) | 30 | 30 |
| Capacity Increasing Rate | Boat Position: Top | 2.0 ± 0.5 | 2.4 ± 0.1 |
|  | Boat Position: Center | 2.2 ± 0.3 | 2.4 ± 0.1 |
|  | Boat Position: Bottom | 2.0 ± 0.4 | 2.4 ± 0.1 |

As seen in the results, capacity increasing rates vary according to the wafer-supporting boat position in Example 1. However, the capacity increasing rates are consistently smaller in Example 1 as compared with those of Example 2. It can be assumed that this is because, in Example 1, after etching a spontaneous oxidation film re-grew, and residual adsorbates were not completely removed by the cycle purge, therefore causing a contaminated source to be brought into the CVD equipment.

In contrast, in Example 2, variation in capacity increasing rates based on wafer-supporting boat position are narrow. Additionally, the capacity increasing rates themselves are approximately 20% larger in Example 2 than those of Example 1. It can be assumed that this is because, in Example 2, after the etching a spontaneous oxidation film did not re-grow, and $H_2O$, $CH_3COOH$, and by-products on the semiconductor wafer were completely removed by the microwaves. Additionally, if the total time required for the etching process is compared between Example 1 and Example 2, it is found that the time was shortened by 40% for Example 2.

According to one embodiment of the present invention, vapor HF etching of a silicon spontaneous oxidation film and chemical oxide on a semiconductor silicon substrate or amorphous silicon can be accomplished. Furthermore, integration of the etching device with CVD equipment possessing an $N_2$ purge box or a vacuum load lock chamber is facilitated.

Additionally, according to one embodiment of the present invention, after etching is completed, $H_2O$, $CH_3OH$, or $CH_3COOH$ and by-products adsorbing and remaining on the surface of a semiconductor wafer are effectively removed, and therefore contamination of the CVD equipment is prevented. Moreover, these contaminates may be removed quickly, thus improving productivity. Consequently, a stable process with high reproducibility has become possible.

What is claimed is:

1. A method for etching semiconductor wafers using a batch-type etching device comprising a reaction chamber, an exhaust port, a wafer supporting boat, a microwave generator, and an inlet port, said method comprising:
    evacuating said reaction chamber using said exhaust port,
    introducing an etching gas using said inlet port until a pressure is attained,
    etching said semiconductor wafers,
    evacuating said reaction chamber after the etching of said semiconductor wafers, wherein residual substances are left on the surface of the wafers by the etching after evacuating, and
    removing the residual substances from surfaces of said wafers by heating with microwaves from the microwave generator said wafers by oscillation of polar molecules of the residual substances.

2. The method according to claim 1, wherein the microwaves are applied from an outside of said reaction chamber to said wafers through a continuous wall of said reaction chamber.

3. The method according to claim 1, wherein the residual substances are $H_2O$, $CH_3OH$, and/or $CH_3COOH$.

4. The method according to claim 1, further comprising purging said reaction chamber with $N_2$ gas during the heating of said wafers.

5. The method according to claim 1, wherein said wafers are stacked vertically, and the microwaves are applied from a side of the stacked wafers.

6. The method according to claim 1, wherein said etching gas comprises HF gas and at least one type of $H_2O$ gas, $CH_3OH$ gas, or $CH_3COOH$ gas.

7. A method for etching semiconductor wafers using a batch-type etching device comprising a reaction chamber, an exhaust port, a wafer supporting boat, a microwave generator, and an inlet port, said method comprising:
    evacuating said reaction chamber using said exhaust port,
    introducing an etching gas using said inlet port until a pressure is attained,
    etching said semiconductor wafers for a first time period, wherein residual substances are left on the surfaces of the wafers by the etching,
    evacuating said reaction chamber after said first time period;
    applying microwaves from an outside of said reaction chamber to said semiconductor wafers for a second time period using said microwave generator, wherein the microwaves remove at least a portion of the residual substances; and
    purging said reaction chamber with $N_2$ gas.

8. The method according to claim 7, wherein the microwaves are applied from an outside of said reaction chamber to said wafers through a continuous wall of said reaction chamber.

9. The method according to claim 7, wherein the residual substances are $H_2O$, $CH_3OH$, and/or $CH_3COOH$.

10. The method according to claim 7, wherein said wafers are stacked vertically, and the microwaves are applied from a side of the stacked wafers.

11. The method according to claim 7, wherein said etching gas comprises HF gas and at least one type of $H_2O$ gas, $CH_3OH$ gas, or $CH_3COOH$ gas.

12. A method for etching semiconductor wafers using a batch-type etching device comprising:
    providing a reaction chamber, an exhaust port, a wafer supporting boat, a microwave generator, and an inlet port, evacuating said reaction chamber using said exhaust port, introducing a reaction gas using said inlet port until a pressure is attained, etching said semiconductor wafers for a first lime period, evacuating said reaction chamber after said first time period, and after the reaction chamber is evacuated, using the microwave generator to apply microwaves to said semiconductor wafers in the reaction chamber.

13. The method according to claim 12, wherein said reaction chamber and said wafer-supporting boat are comprised of a material which has corrosion resistance against HF and which is transparent to microwave energy.

14. The method according to claim 12, wherein said reaction chamber and said wafer-supporting boat are comprised of $Al_2O_3$ or polypropylene.

15. The method according to claim 12, wherein the frequency of said microwaves is 2.45 GHz.

16. The method according to claim 12, wherein said reaction gas comprises HF gas and at least one type of $H_2O$ gas, $CH_3OH$ gas, or $CH_3COOH$ gas.

17. The method according to claim 12, further comprising purging said reaction chamber with $N_2$ gas after applying said microwaves.

* * * * *

UNITED STATES PATENT AND TRADEMARK OFFICE
CERTIFICATE OF CORRECTION

| | | |
|---|---|---|
| PATENT NO. | : 6,914,208 B2 | Page 1 of 1 |
| APPLICATION NO. | : 10/706624 | |
| DATED | : July 5, 2005 | |
| INVENTOR(S) | : Shimizu et al. | |

It is certified that error appears in the above-identified patent and that said Letters Patent is hereby corrected as shown below:

At column 6, line 12, please delete "surface" and insert --surfaces--, therefor.

At column 7, line 4, please delete "lime" and insert --time--, therefor.

Signed and Sealed this

Fourteenth Day of November, 2006

JON W. DUDAS
*Director of the United States Patent and Trademark Office*